United States Patent [19]

Grabbe et al.

[11] 4,402,561

[45] Sep. 6, 1983

[54] SOCKET FOR INTEGRATED CIRCUIT PACKAGE WITH EXTENDED LEADS

[75] Inventors: Dimitry G. Grabbe, Lisbon Falls, Me.; Iosif Korsunsky, Harrisburg, Pa.

[73] Assignee: AMP Incorporated, Harrisburg, Pa.

[21] Appl. No.: 248,606

[22] Filed: Mar. 27, 1981

[51] Int. Cl.³ ............................................... H05K 1/04
[52] U.S. Cl. ........................... 339/17 CF; 339/75 MP
[58] Field of Search ........... 339/17 CF, 75 MP, 75 M

[56] References Cited

U.S. PATENT DOCUMENTS

| | | | |
|---|---|---|---|
| 3,192,307 | 6/1965 | Lazar | 339/17 CF X |
| 3,663,921 | 5/1972 | Richard | 339/17 CF |
| 3,757,271 | 9/1973 | Judge et al. | 339/17 CF |
| 4,164,003 | 8/1979 | Cutchaw | 339/17 CF X |
| 4,330,163 | 5/1982 | Aikens et al. | 339/17 CF |
| 4,346,952 | 8/1982 | Bright et al. | 339/17 CF |

FOREIGN PATENT DOCUMENTS 2423623  11/1975  Fed. Rep. of Germany ... 339/17 CF

*Primary Examiner*—Willie G. Abercrombie

[57] ABSTRACT

A socket for connecting an integrated circuit package to a printed circuit board or the like wherein the connection between the circuit board and the semiconductor chip is as short as possible. This is accomplished by providing a straight line conductor between the integrated circuit package and the printed circuit board. In accordance with one embodiment, a contact in the form of a movable double ended sharp needle is employed to connect the lead from the package to the lead on a substrate. In order to provide the force mating the leads and the intermediate needle, external force is provided by a spring structure comprising a multi-fingered element with the tips of the fingers encapsulated in plastic or other compliant membrane separating the spring member and the leads of the package.

7 Claims, 6 Drawing Figures

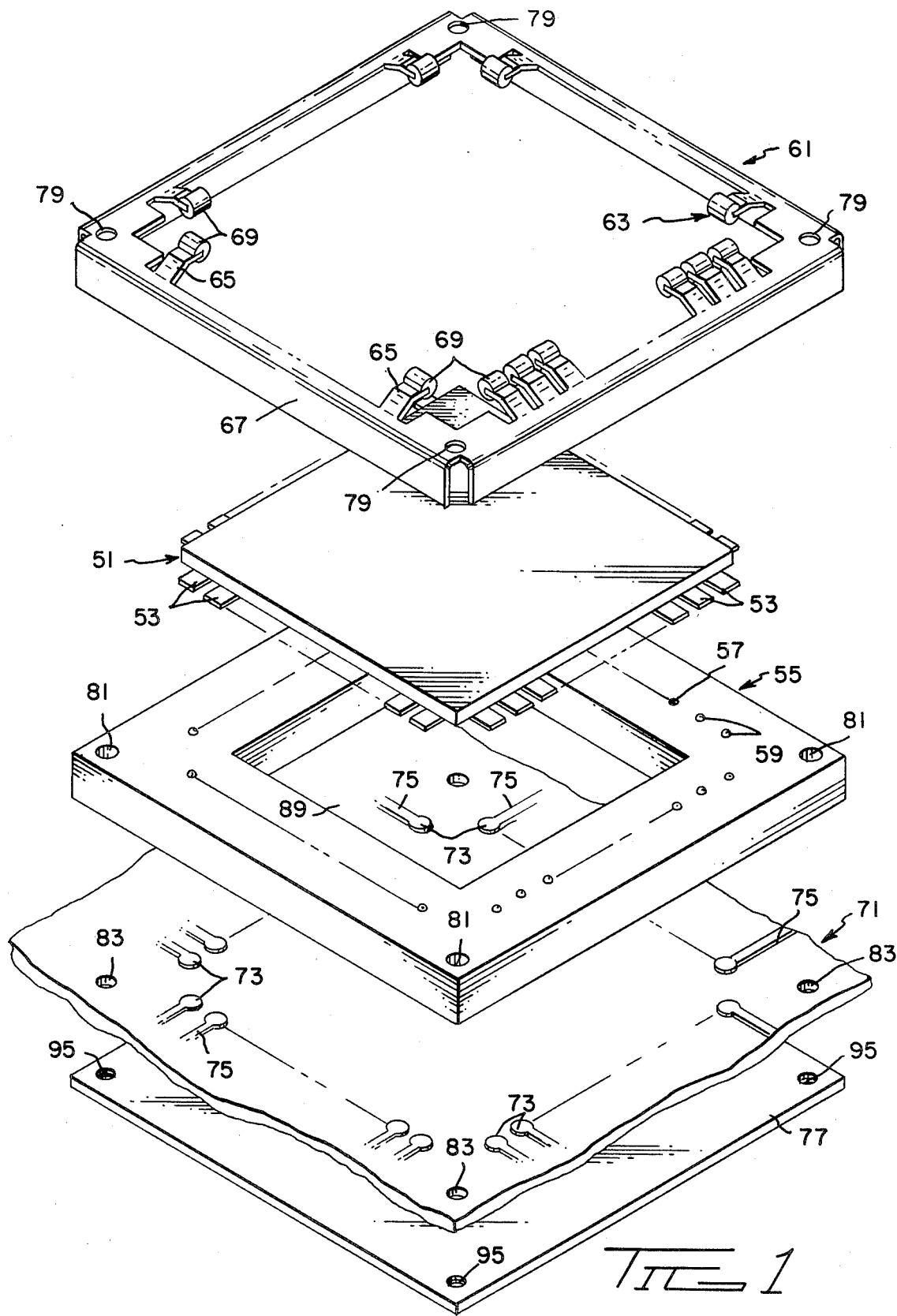

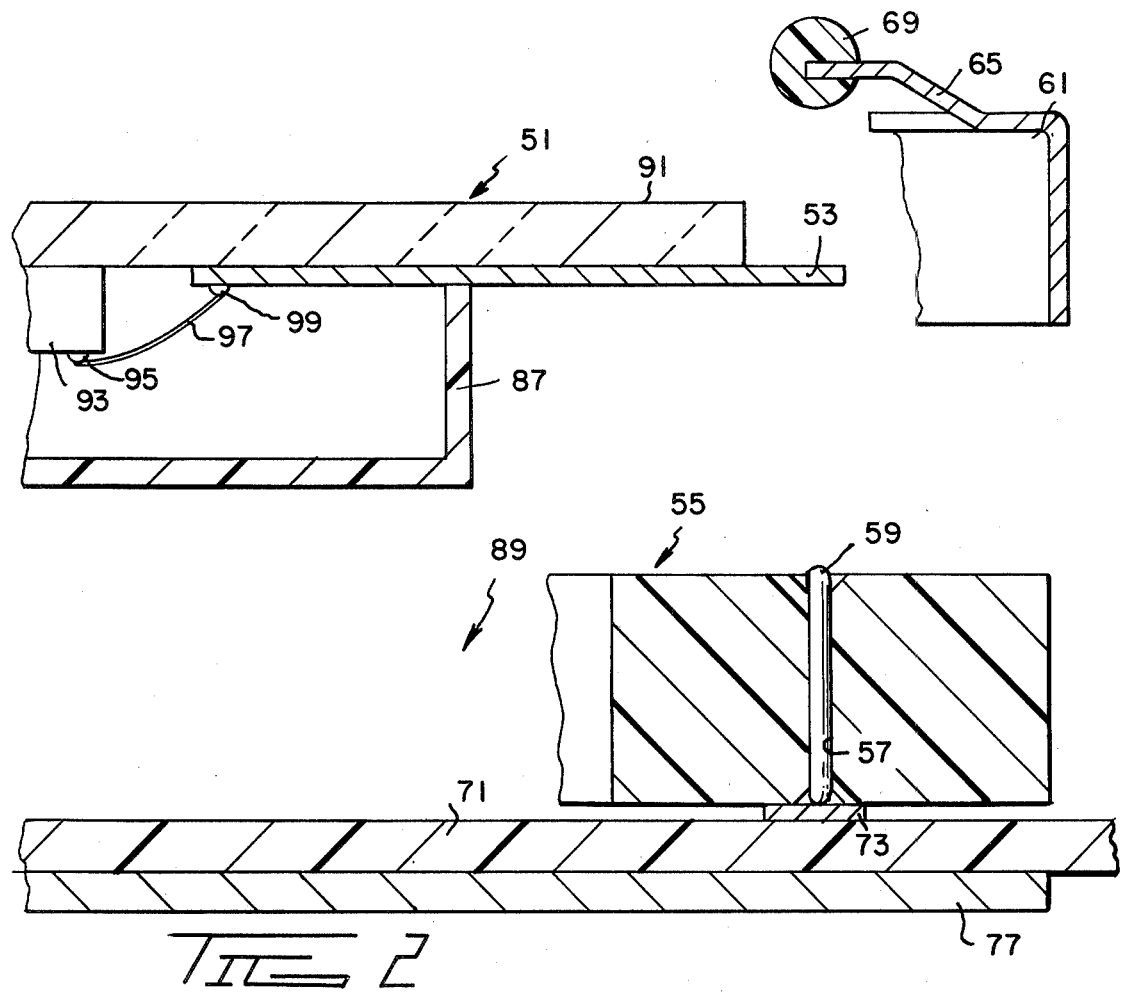
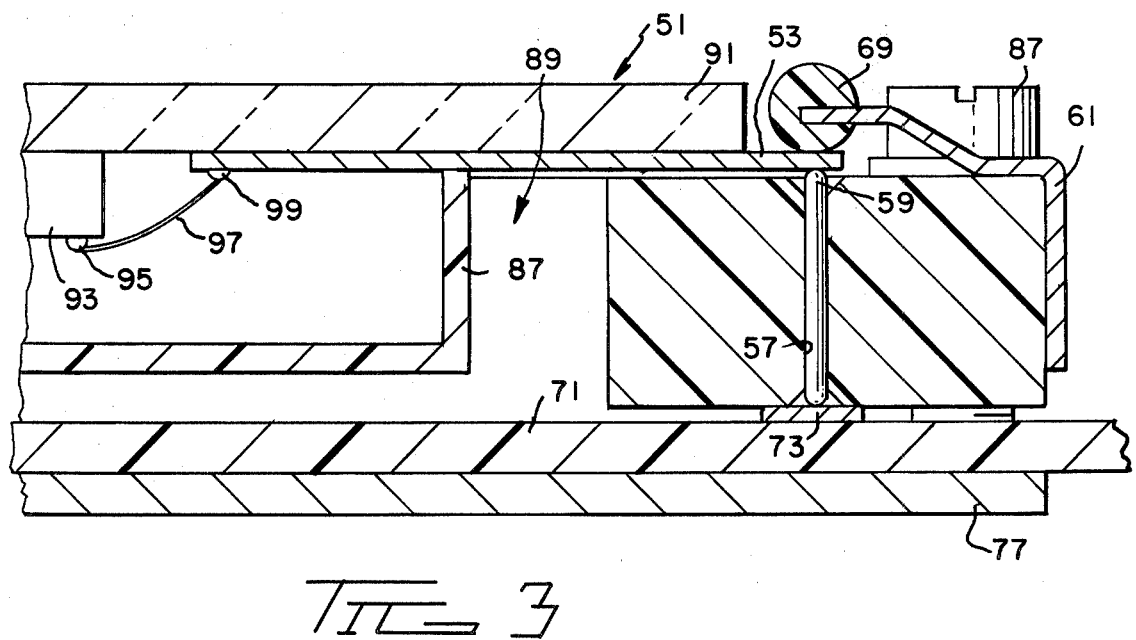

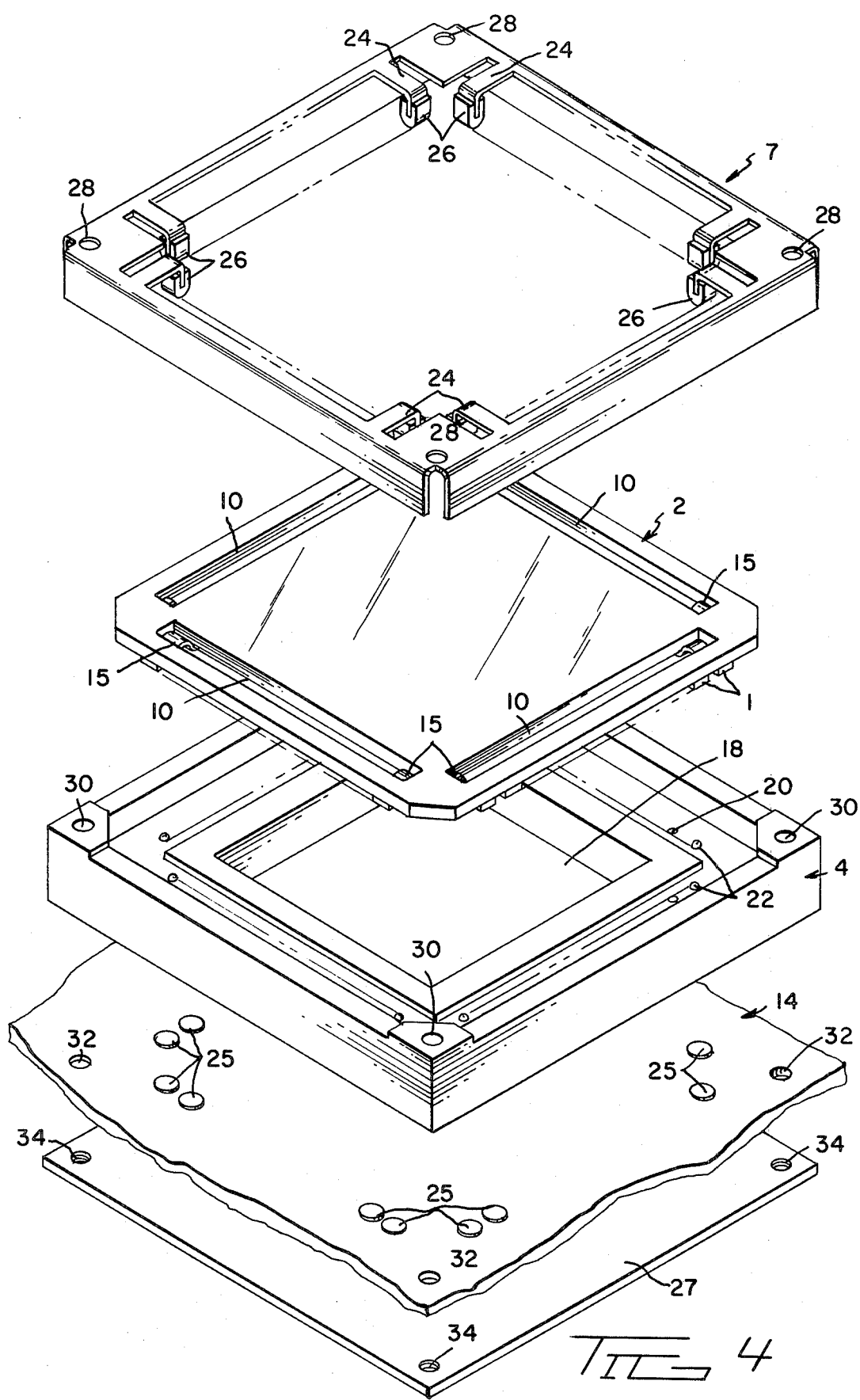

SOCKET FOR INTEGRATED CIRCUIT PACKAGE WITH EXTENDED LEADS

BACKGROUND OF THE INVENTION

1. Field of the Invention

This invention relates to sockets for chip carriers for semiconductor chips and to the method of making them.

2. Description of the Prior Art

Semiconductor chips such as integrated circuits are normally mounted on chip carriers as is well known in the prior art. These chip carriers include ceramic elements or other insulating material upon which the chips are mounted with lead frames extending from pads on the chips to the exterior of the chip carrier for interconnection with elements of the outside world such as, for example, printed circuit boards. The prior art chip carriers have functioned very satisfactorily for their intended purpose in the past. However, the speed of operation of the circuits has increased and continues to increase. Since the chip carriers themselves are normally formed of ceramic and the like which are good dielectric materials, the semiconductor packages have built in capacitance and self-inductance in the leads required for the bonding pads on the chips to the external world. These capacitances and inductances are a function of frequency and increase as the speed of operation increases. The increase in system inductance and capacitance decreases the speed at which the circuits are capable of operating. These capacitances and inductances also appear in the sockets which connect the packages to printed circuit boards and the like. It is desirable to increase the operating speed of electronic components and, for this reason, it is necessary to decrease the built-in capacitance and self-inductance in the semiconductor chip package as well as in the sockets therefor.

It is known that, the longer the leads, the greater will be the built in capacitance and self-inductance. It is therefore the desire to provide a socket for an integrated circuit package with extended leads that has minimum inductive and capacitive properties when making connection to a separable device.

SUMMARY OF THE INVENTION

In accordance with the present invention, there is provided a socket for connecting an integrated circuit package to a printed circuit board or the like wherein the connection between the circuit board and the semiconductor chip is as short as possible. This is accomplished by providing a straight line conductor between the integrated circuit package and the printed circuit board. In accordance with one embodiment of the present invention, a contact in the form of a double ended movable sharp needle is employed to connect the lead from the package to the lead on a substrate. In order to provide the force mating the leads and the intermediate needle, external force is provided by a spring structure comprising a multi-fingered element with the tips of the fingers encapsulated in plastic or other compliant membrane separating the spring member and the lead of the package.

BRIEF DESCRIPTION OF THE DRAWINGS

FIG. 1 is an exploded view of a socket for a chip carrier in accordance with the first embodiment of the present invention;

FIG. 2 is a partial cross-sectional exploded view of the embodiment of FIG. 1;

FIG. 3 is a cross-section as in FIG. 2 with the parts connected together;

FIG. 4 is an exploded view of a second embodiment of a socket in accordance with the present invention;

DESCRIPTION OF THE PREFERRED EMBODIMENTS

Figure 5:
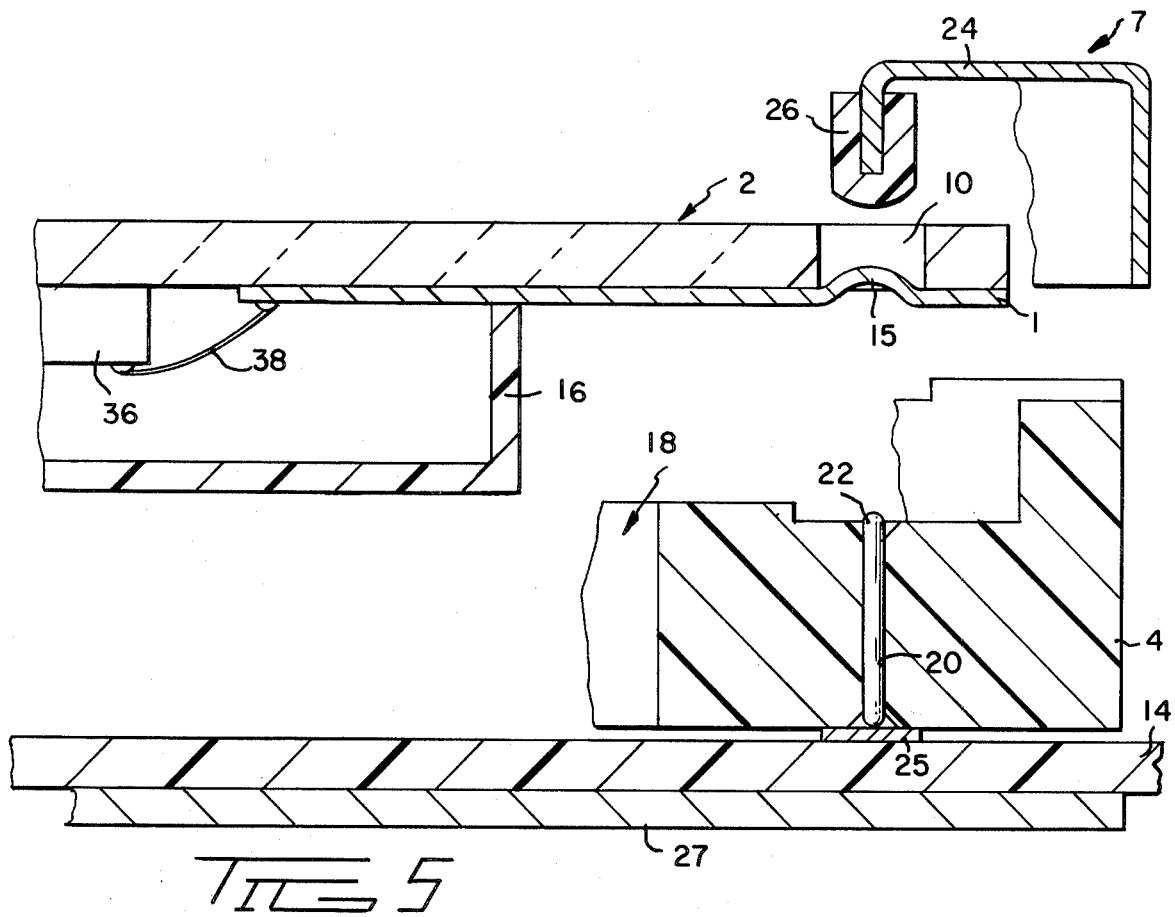
FIG. 5 is a partial exploded view in cross-section of the embodiment of FIG. 4.

Referring first to FIG. 1, there is shown an exploded view of a socket for an integrated circuit package in accordance with the present invention. There is shown an integrated circuit chip carrier 51 having leads 53 extending therefrom. The chip carrier is fitted into a plastic housing 55 having apertures 57 positioned about the periphery thereof in a rectangular shape with needles or pins 59 positioned and movable in each of the apertures 57. The pins 59 are longer than the length of apertures 57. A pressure providing cover frame 61 is positioned above the chip carrier 51 and includes thereon a plurality of pressure fingers 63, each having a spring portion 65 extending from the frame 67, each of the spring members 65 having an electrically insulating compliant hold-down membrane 69 thereon. There is one hold-down finger 69 and spring 65 aligned with each of the leads 53 of the chip carrier 51. Beneath the housing 55 is a printed circuit board 71 having a plurality of electrically conducting pads 73 positioned thereabout and aligned with the apertures 57, the printed circuit board 71 having electrically conductive leads 75 thereon extending from the pads 73 to other areas in the printed circuit board or through apertures in the printed circuit board or the edges of the printed circuit boards as are well known in the art. Beneath the printed circuit board 71 is an electrically insulating plate 77 to provide appropriate backing. It can be seen that the cover frame 61 includes apertures 79 in the four corners thereof, these being aligned with the apertures 81 in housing 55, the aperture 83 in the printed circuit board 71 and the apertures 95 in the insulating plate 77. A nut 87 (shown in FIG. 3) passing through each of the apertures in alignment with each other and a bolt or the like (not shown) in well known manner will connect together each of the members 61, 51, 55, 71 and 77 of FIG. 1 in the manner shown in FIG. 3.

Referring now to FIGS. 2 and 3, it can be seen that the chip carrier 51 has a depending region 87 which fits into the central rectangular aperture 89 in the housing 55. Within the region 87 and against the ceramic member 91 is a semiconductor chip 93 with a pad 95 thereon. A wire 97 connects pad 95 to pad 99 on the lead 53 which is formed on the ceramic member 91 and extends beyond the edge of the ceramic member. The lead 53 is resilient. The pressure member 61 is positioned whereby the spring member 65 with insulating member 69 thereon normally pushes the lead of terminal 53 downwardly against the movable needle or pin 59. The pin 59 is above one of the pads 73 on the printed circuit board 71 and thereby is forced to move against both the terminal 53 and the pad 73 to provide good electrical connection between the lead frame of the chip carrier 51 and the pad on the printed circuit board 71. It can be seen that the path between the terminal 53 and the pad 73 is a straight line, thereby providing the shortest possible path between the terminal and the pad and materially reducing the capacitance and self-inductance of the connection.

Figure 6:
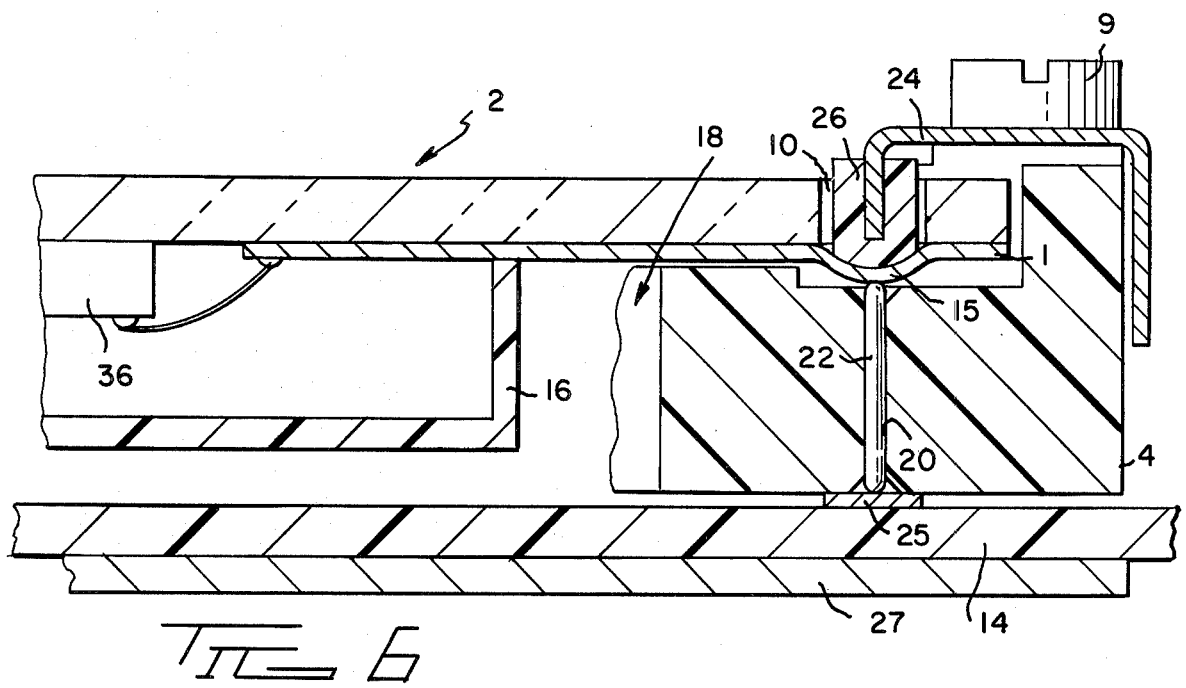
FIG. 6 is a partial cross-sectional view as in FIG. 5 with the parts connected together.

Referring now to FIG. 4, there is shown an exploded view of a second embodiment of the present invention. Again there is shown a ceramic chip carrier 2 having cut-out windows 10 of rectangular shape within the four edges of the chip carrier. A resilient lead portion 15 of an etched or stamped copper-lead frame 1 (FIGS. 5 and 6) is positioned within the cut-out windows 10 for each of the leads from the semiconductor chip as will be explained in more detail hereinbelow. The chip carrier has a depending portion 16 of rectangular shape as best shown in FIGS. 5 and 6 which fits into a rectangular aperture 18 in the plastic housing 4. The plastic housing 4 also includes a plurality of apertures 26 formed therein into which movable electrically conductive pins 22 are positioned. The pins 22 are longer than the length of apertures 20 and are vertically movable therein. A pressure frame 7 is positioned above the chip carrier 2 and includes spring members 24 with insulating fingers 26 thereon, there being a spring member 24 with insulating finger 26 aligned with each of the resilient portions 15 of the lead frame 1. Beneath the housing 4 is a printed circuit board 14 having pads 25 thereon aligned with the apertures 20 of the housing 4. An insulating backing member 57 is positioned beneath the printed circuit board 14. The pressure frame 7 includes apertures 25 at the corners thereof which are aligned with the apertures 30 in housing 4, the apertures 32 in printed circuit board 14 and the apertures 34 in the backing member 27. A nut 9, (FIG. 6) passes through each of the apertures 28, 30, 32 and 34 and is secured by a bolt (not shown) or the like.

In the assembled state as shown in FIG. 6, there can be seen the semiconductor chip 36 with the chip carrier 2 with a lead 38 passing to the lead frame 1. The lead frame 1 extends along the ceramic chip carrier 2 up to the cut-out windows 10 wherein the copper leads are bowed slightly at 15 and are resilient, the copper leads finally ending on the ceramic chip carrier beyond the window 10. The pin 22, which is electrically conductive, is positioned within the aperture 20 in the housing 4 and is positioned above a pad 25 in the printed circuit board 14 and in contact with the bowed portion 15. A downward force is provided by the spring 24 via the finger 26 which moves the resilient bowed region 15 against the pin 5 as shown in FIG. 6 and provides a pressure so that the pin moves in the aperture 20 and makes good electrical contact with the lead frame 1 at region 15 and the pad 25 on the printed circuit board 14. As in the prior embodiment, it can be seen that the path between the lead frame 1 and the pad 25 is a straight path and therefore the shortest distance between the two leads. For this reason, the capacitance as well as self-inductance generated at the higher frequencies is minimized.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A socket for connecting a semiconductor chip carrier having resilient leads to a printed circuit board or the like comprising:
    (a) a housing for holding said chip carrier, said housing including,
    (b) a plurality of spaced-apart apertures aligned with said leads,
    (c) electrically conductive needles slidably disposed in said apertures and being freely disposed therein, and having an axial dimension greater than the axial length of said apertures, and
    (d) pressure means for applying a force on said leads in the direction of said needles whereby said leads force said needles into said apertures and thereby against electrical circuit paths contained on said board, said paths aligned with said apertures and having said board secured to said frame and said housing.

2. A socket as set forth in claim 1 wherein said pressure means includes spring means secured to said frame and finger means secured to said spring means for forcing said leads against said needles.

3. A socket as set forth in claim 1 wherein said chip carrier has a surface including a semiconductor device secured thereto and a lead frame on said surface forming said leads, said leads extending beyond the edges of said carrier and parallel to said surface.

4. A socket as set forth in claim 1 wherein said chip carrier has a surface including a semiconductor device secured thereto and a lead frame on said surface forming said leads, said leads extending beyond the edges of said carrier and parallel to said surface.

5. A socket as set forth in claim 2 wherein said chip carrier has a surface including a semiconductor device secured thereto and a lead frame on said surface forming said leads, said leads extending beyond the edges of said carrier and parallel to said surface.

6. A socket as set forth in claim 1 wherein said carrier includes window aperture means therein, said leads extending across said aperture means and secured to said carrier on both sides of said aperture means, said leads each including a movable portion positioned within said window aperture means, said movable portion being aligned with said pressure means and said apertures in said frame.

7. A socket as set forth in claim 2 wherein said carrier includes window aperture means therein, said leads extending across said aperture means and secured to said carrier on both sides of said aperture means, said leads each including a movable portion positioned within said window aperture means, said movable portion being aligned with said pressure means and said apertures in said frame.

* * * * *